United States Patent
Yen et al.

(10) Patent No.: US 10,955,750 B2
(45) Date of Patent: Mar. 23, 2021

(54) LITHOGRAPHY SYSTEM AND METHOD THEREOF

(71) Applicant: TAIWAN SEMICONDUCTOR MANUFACTURING CO., LTD., Hsinchu (TW)

(72) Inventors: Wei-Chun Yen, Hsinchu County (TW); Chi Yang, Taichung (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/512,811

(22) Filed: Jul. 16, 2019

(65) Prior Publication Data
US 2021/0018845 A1      Jan. 21, 2021

(51) Int. Cl.
G03B 27/54      (2006.01)
G03F 7/20       (2006.01)
H05G 2/00       (2006.01)
H01L 21/027     (2006.01)

(52) U.S. Cl.
CPC ........ G03F 7/70033 (2013.01); G03F 7/7055 (2013.01); H05G 2/003 (2013.01); H05G 2/008 (2013.01); H01L 21/0274 (2013.01)

(58) Field of Classification Search
CPC ... G03F 7/70033; G03F 7/7055; H05G 2/003; H05G 2/008; H01L 21/0274
See application file for complete search history.

(56) References Cited

U.S. PATENT DOCUMENTS

| | | | |
|---|---|---|---|
| 2015/0261094 A1* | 9/2015 | Huang | G03F 7/70033 355/67 |
| 2017/0059837 A1* | 3/2017 | Kim | G02B 19/0019 |
| 2019/0056669 A1* | 2/2019 | Weidman | G03F 7/70083 |
| 2019/0094718 A1* | 3/2019 | Yang | G03F 7/70533 |
| 2019/0104604 A1* | 4/2019 | Chien | G21K 1/062 |

* cited by examiner

*Primary Examiner* — Peter B Kim
(74) *Attorney, Agent, or Firm* — McClure, Qualey & Rodack, LLP (57) ABSTRACT

A method includes generating a plasma that emits a first EUV radiation in a vessel at a first gas exhaust rate of the vessel; directing the first EUV radiation to a first substrate using a collector in the vessel; halting the generating of the first EUV radiation; and ejecting a gas past the collector at a second gas exhaust rate of the vessel, in which the second gas exhaust rate is greater than the first gas exhaust rate after the halting.

20 Claims, 8 Drawing Sheets

LITHOGRAPHY SYSTEM AND METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with the minimum pitch of 32 nm and 22 nm, etc., several techniques, e.g., the attenuated phase-shifting mask (AttPSM) and the alternating phase-shifting mask (AltPSM), have been developed to obtain resolution enhancement for EUVL. But each technique has its limitation needed to be overcome. For example, an absorption layer however may not fully absorb the incident light and a portion of the incident light is reflected from the absorption layer. Also the thickness of the absorption layer causes the shadowing effect. All of these often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Figure 1:
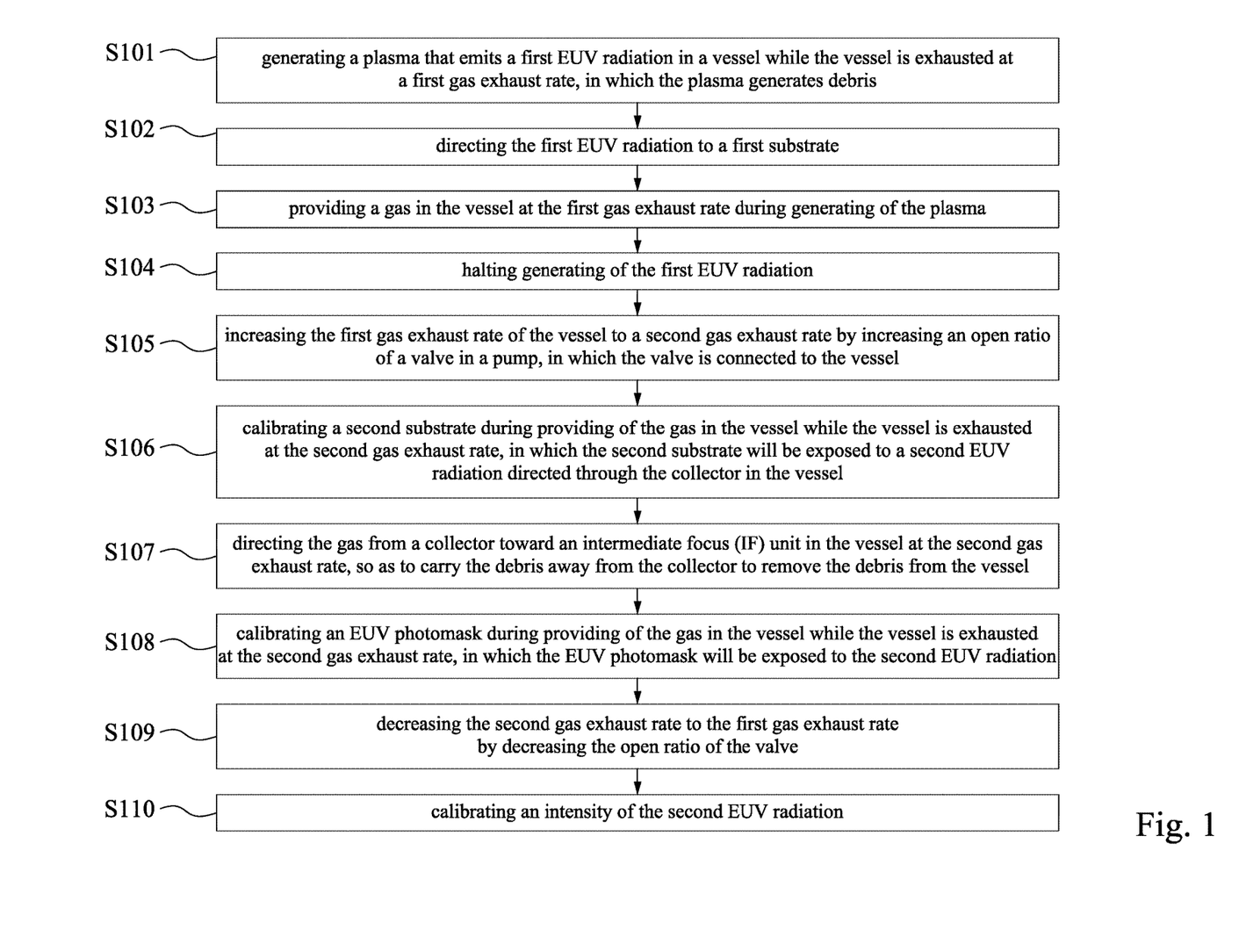
FIG. 1 is a method in accordance with some embodiments of the present disclosure.

FIG. 1 illustrates an exemplary method M in accordance with some embodiments. The method M includes a relevant part of the entire manufacturing process. The method M may be implemented, in whole or in part, by a system employing extreme ultraviolet (EUV) lithography and other appropriate lithography processes to improve pattern dimension accuracy. Additional operations can be provided before, during, and after the method M, and some operations described can be replaced, eliminated, modified, moved around, or relocated for additional embodiments of the method. One of ordinary skill in the art may recognize other examples of semiconductor fabrication processes that may benefit from aspects of the present disclosure. The method M is an example, and is not intended to limit the present disclosure beyond what is explicitly recited in the claims.

Figure 2A:
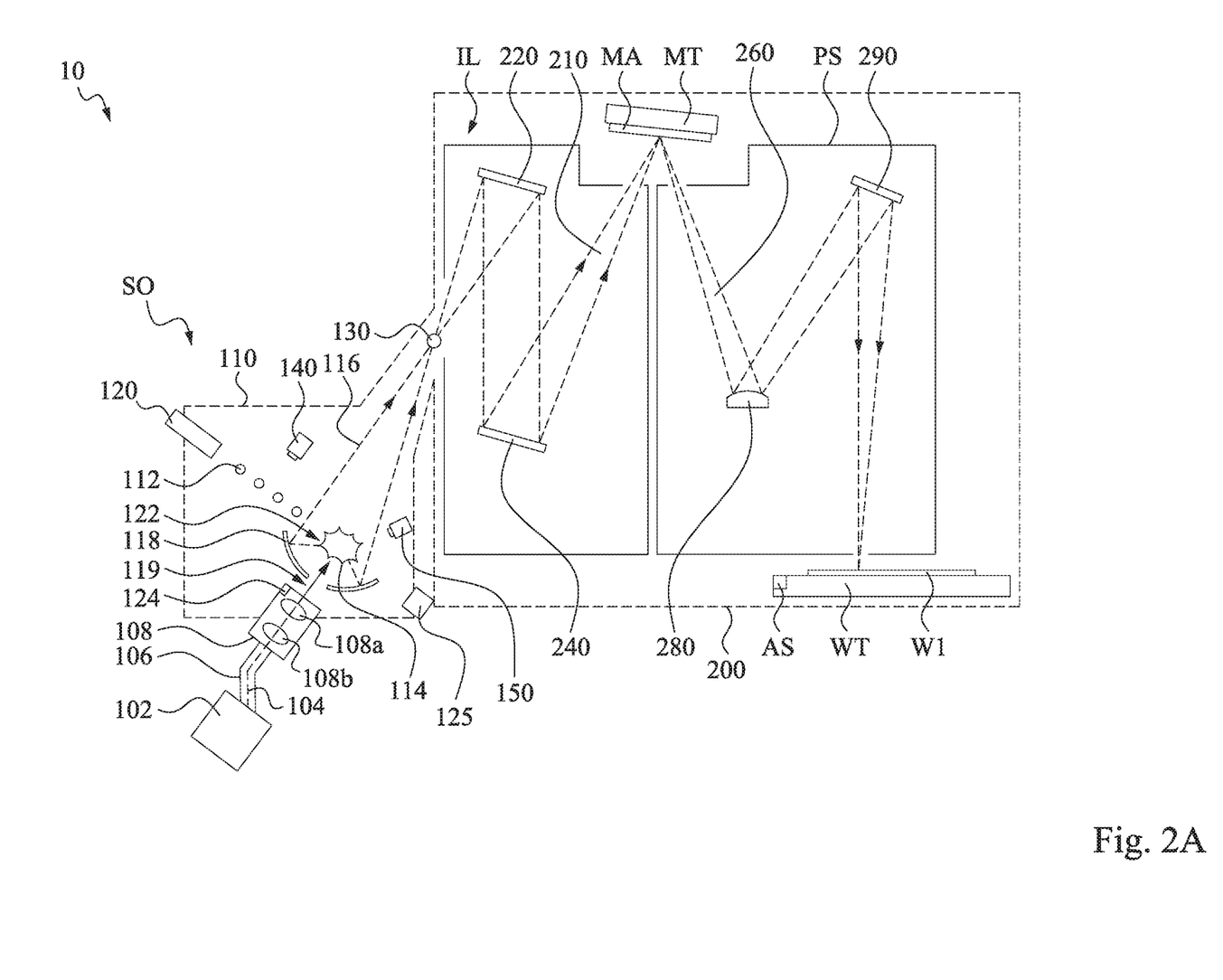
FIG. 2A is a schematic view of lithography system in accordance with some embodiments of the present disclosure.

The method M is described below in conjunction with FIGS. 2A-5. FIGS. 2A-5 illustrate various stages of the method M according to some embodiments of the present disclosure. The method M begins at block S101 where a plasma is generated and emits a first EUV radiation in a vessel while the vessel is exhausted at a first gas exhaust rate, in which the plasma generates debris. Referring to FIG. 2A, in some embodiments of block S101, shown there is a EUV lithography system 10. Although the EUV lithography system 10 is illustrated as having a certain configuration of components, it will be appreciated that the disclosed EUV lithography system 10 may include additional components (e.g., additional mirrors) or having less components (e.g., less mirrors).

In FIG. 2A, the EUV lithography system 10 includes a source collector module SO that includes a source vessel 110. A droplet generator 120 is connected to the source vessel 110 and is configured to generate a plurality of fuel droplets 112. In some embodiments, the fuel droplets 112 generated by the fuel droplet generator 120 are provided into the EUV source vessel 110. In some embodiments, the fuel droplets 112 may include tin (Sn). In other embodiments, the fuel droplets 112 may include a different metal material. In some embodiments, the source vessel 110 can also be referred to as a radiation source, in which radiation source employs a laser produced plasma (LPP) mechanism to generate plasma and further generate EUV light from the plasma. In some embodiments, the first gas exhaust rate in the source vessel 110 shown in FIG. 2A is less than about 400 L/s. In some embodiments, a pressure in the source vessel 110 shown in FIG. 2A is in a range from about 1 mm Bar to about 3 mm Bar in response to the first gas exhaust rate. Thus, a selected gas number density in the irradiation region 122 of the source vessel 110 and/or a selected gas composition, e.g. a selected ratio of several gases, e.g. $H_2$, HBr, He, etc can be maintained. Therefore, amount of the plasma 114 can be generated for creating effective and efficient EUV light.

In some embodiments, the first gas exhaust rate in the source vessel 110 shown in FIG. 2A is less than about 450 L/s to maintain a selected gas number density in the irradiation region 122 of the source vessel 110 and/or a selected gas composition. In some embodiments, the first gas exhaust rate in the source vessel 110 shown in FIG. 2A is less than about 350 Ls to maintain a selected gas number density in the irradiation region 122 of the source vessel 110 and/or a selected gas composition.

The EUV lithography system 10 may also include a droplet position detection system which may include a droplet imager 140 disposed in the source vessel 110 that captures an image of one or more fuel droplets 112. The droplet imager 140 may provide this captured image to a droplet position detection feedback system (not shown), which can, e.g., generate a droplet position and trajectory in response an analysis result of the captured image. The position detection feedback system can thus generate a droplet error in response to the generated droplet position and trajectory, e.g., based on a droplet-by-droplet basis, or on average. In some embodiments, the droplet imager 140 may include a fine droplet steering camera (FDSC), a droplet formation camera (DFC), and/or suitable devices.

The EUV lithography system 10 further includes a primary laser having a laser source 102 configured to produce a laser beam 104. In some embodiments, the laser source 102 may include a multi-stage laser having a plurality of stages configured to amplify laser light produced by a prior stage. The laser beam 104 passes through a beam transport system 106 configured to provide the laser beam to a focusing system 108. The beam transport system 106 receives the light beam104 and steers and modifies the light beam104 as needed and outputs the light beam104 to the focusing system 108. The focusing system 108 includes one or more lenses 108a, 108b and/or mirrors arranged within a beam line and configured to focus the laser beam 104. The laser beam 104 is output from the focusing system 108 to the EUV source vessel 110 along a drive axis toward an irradiation region 122. The focusing system 108 can also steer the beam104 or adjust a position of the beam104 relative to the irradiation region 122. The drive axis of the amplified laser beam 104 can be considered as the approximate center of the laser beam 104 or the general direction that the laser beam 104 is traveling because the laser beam 104 may be irregularly shaped and/or asymmetrical.

The laser beam 104 transmits through a collector mirror 118 located within the source vessel 110. Then, the primary laser beam 104 generated by the laser source 102 intersects the fuel droplets 112. In some embodiments, the primary laser beam 104 may be a carbon dioxide ($CO_2$) laser. In other embodiments, the primary laser beam 104 may include alternative types of lasers. When the primary laser beam 104 strikes the fuel droplets 112, the primary laser beam 104 heats the fuel droplets 112 to a critical temperature. At the critical temperature, the fuel droplets 112 shed their electrons and become a plasma 114 including a plurality of ions at the irradiation region 122. In some embodiments, the ions emit EUV radiation 116 (e.g., having a wavelength of approximately 13.3 nm to about 13.7 nm).

By-products of the EUV radiation 116 may include metal dust, target material vapor and micro-droplets or clusters and can be in several forms, for example, when tin, e.g., pure tin, or a tin compound, e.g., $SnBr_4$, $SnH_4$, $SnBr_2$ etc, is used as the source material, the by-products may include tin and tin compounds including oxides. Dusts and other contaminates, e.g., from collector mirror 118 erosion, etc. may also be present in the source vessel 110. These by-products may, among other things, damage optics and absorb/scatter EUV radiation 116. In some embodiments, target material debris deposits can be present in many forms. By way of example, particulates, can deposit on the surface of the collector mirror 118.

In some embodiments, the collector mirror 118 has a concave curvature. In some embodiments, the collector mirror 118 includes a center aperture 119. The center aperture 119 allows the primary laser beam 104 to pass through to an irradiation region 122. In some embodiments, the collector mirror 118 may include a multi-layer coating having alternating layers of different materials. For example, in some embodiments, the collector mirror 118 may include alternating layers of molybdenum and silicon configured to operate as a Bragg reflector. The concave curvature of the collector mirror 118 focuses the EUV radiation 116 generated by the plasma 114 toward an intermediate focus (IF) unit 130 within an exit aperture of the source vessel 110. The intermediate focus unit 130 is located between the source vessel 110 and a scanner 200 including optical elements configured to direct the EUV radiation 116 to a workpiece (e.g., a semiconductor substrate). In some embodiments, the intermediate focus unit 130 may include a cone shaped aperture configured to provide for separation of pressures between the source vessel 110 and the scanner 200. In some embodiments, the intermediate focus unit 130 may extend into the scanner 200 which including an illumination system IL and a projection system PS. The EUV radiation 116 output from the source vessel 110 is provided to an illumination optics unit IL by way of the intermediate focus unit 130.

Returning to FIG. 1, the method M then proceeds to block S102 where the first EUV radiation is directed to a first substrate. With reference to FIG. 2A, in some embodiments of block S102, the EUV radiation 116 traverses the illumination system IL, which may include a facetted field mirror device 220 and a facetted pupil mirror device 240 arranged to provide a desired angular distribution of the radiation beam 210, at the patterning device MA, as well as a desired uniformity of radiation intensity at the patterning device MA. Upon reflection of the radiation beam 210 at the patterning device MA, held by the support structure MT, a patterned beam 260 is formed and the patterned beam 260 is imaged by the projection system PS via reflective elements 280, 290 onto a substrate W1 held by the substrate table WT.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

More elements than shown may generally be present in illumination optics unit IL and projection system PS. A grating spectral filter may optionally be present, depending upon the type of lithographic apparatus. Further, there may be more mirrors present than those shown in the Figures, for example there may be 1-6 additional reflective elements present in the projection system PS than shown in FIG. 2A.

The EUV lithography system 10 may also include an EUV energy monitor 150 disposed in the source vessel 110. The EUV energy monitor 150 is designed to monitor the EUV intensity or energy generated from the source vessel 110. For example, the EUV energy monitor 150 includes an EUV sensing element, such as a diode, designed to be sensitive to the EUV light and configured to effectively detect the EUV light. In other examples, the EUV energy monitor 150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. Generally, the dose error is related to the plasma instability, through monitoring the EUV intensity by the EUV energy monitor 150, the dose error can be extracted from the monitored EUV intensity. Therefore, when a dose error is occurred, it indicates that the plasma 114 is unstable.

In some embodiments, the EUV lithography system further includes a droplet collection element 125 disposed in the source vessel 110 and located opposite to the droplet generator 120. The droplet collection element 125 is configured to collect fuel droplets 112 that are not vaporized during formation of the EUV radiation 116 and/or fragments of fuel droplets 112 generated during formation of the EUV radiation 116.

Figure 2B:
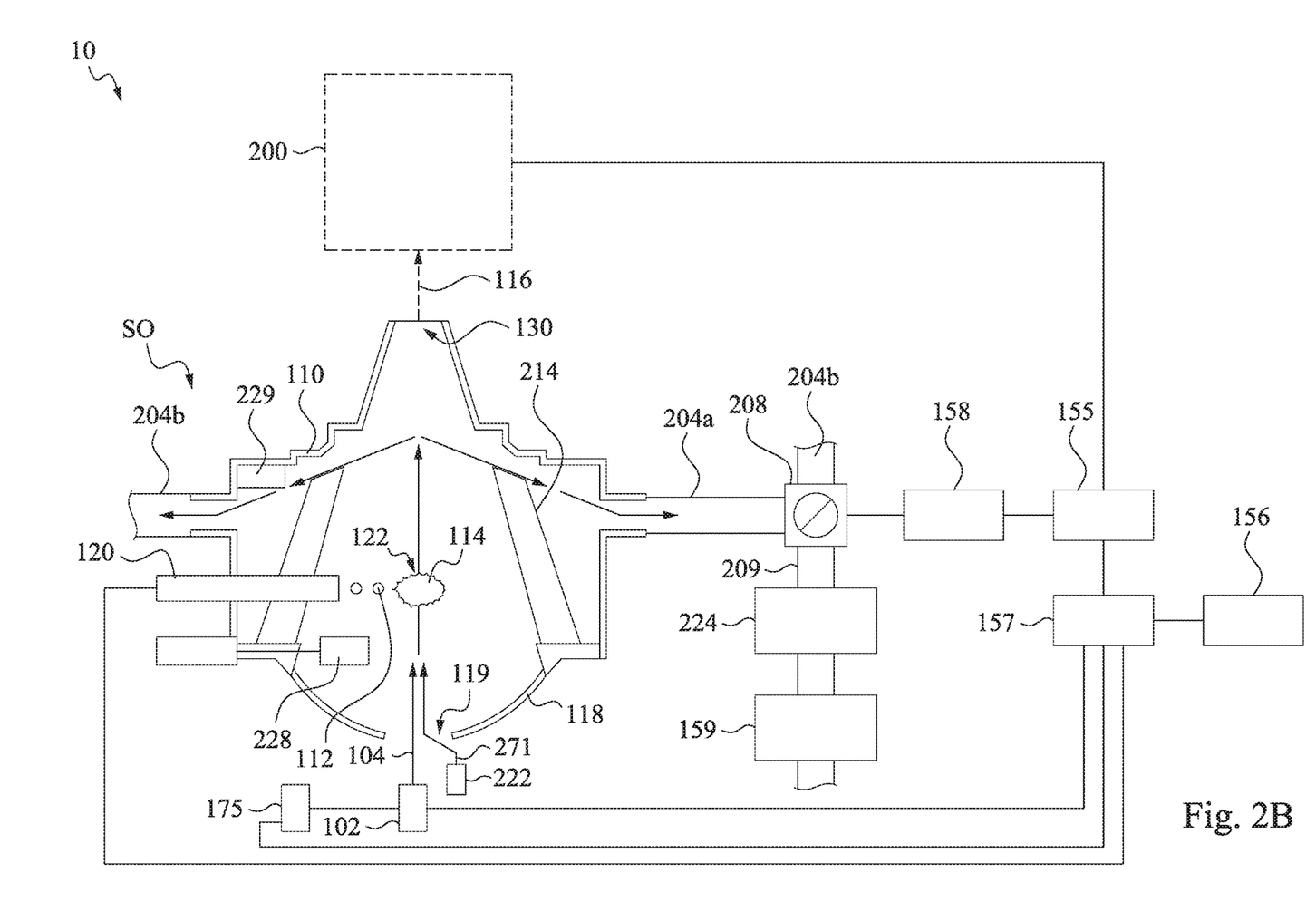
FIG. 2B is a schematic view of lithography system in accordance with some embodiments of the present disclosure.

Returning to FIG. 1, the method M then proceeds to block S103 where a gas is provided in the vessel at the first gas exhaust rate during generating of the plasma. With reference to FIG. 2B, in some embodiments of block S103, the source collector module SO may include a regulated gas source 222 for selectively introducing, either continuously or in discrete amounts, one or more gas(es) into the source vessel 110, e.g. for ion stopping (e.g. $H_2$, (protium and/or deuterium isotopes) and/or He). It is to be appreciated that the gas source 222 may include one or more flow regulators (not shown). In some embodiments, a purge gas supply mechanism may fix the flow rate of the purge gas from the gas source 222 at a constant level by using the flow rate control valve such as a throttle valve, and the MFC or the pressure control loop may be omitted.

In some embodiments, the gas source 222 is disposed proximate to the center aperture 119 such that gas 271 generated therein are output through the center aperture 119 of the collector mirror 118. In some embodiments, the gas 271 includes hydrogen and/or hydrogen radicals H*. For example, the gas 271 generated central in situ hydrogen radical sources provide hydrogen radicals proximate to the target material debris deposited on the collector mirror 118 and near the center aperture 119. It should be noted that the gas 271 can be any sort of hydrogen radical source described herein. In some embodiments, the tin in the target material debris deposits converts to volatile tin compounds such as $SnH_4$ by the hydrogen radicals H*. In some embodiments, the gas source 222 has a signal source and a hydrogen nozzle injects hydrogen into a magnetic field generated by an induction coil to create a hydrogen plasma that produces the hydrogen radicals H*. In some embodiments, the gas 271 may be also referred to as a carrier gas.

In FIG. 2B, it can be seen that within each closed loop flow path, gas is directed through the center aperture 119 formed in the collector mirror 118 and toward the irradiation region 122. Although, other center apertures may be provided and used to flow gas through the collector mirror 118. Moreover, other suitable flow paths may be established within the source vessel 110. A portion of the gas 271 from the center aperture 119 may flow within source vessel 110 through a vane structure 214.

As shown in FIG. 2B, the vane structure 214 may be disposed between the collector mirror 118 and the intermediate focus unit 130 and may include a plurality of vanes that are arranged to allow light to travel from the collector mirror 118 to the intermediate focus unit 130. In some embodiments, the vane structure 214 may be formed with internal passages to flow a heat exchange fluid, e.g. water or liquid gallium, to cool each vane. The vane structure 214 may function to cool gas flowing through thereof and/or to condense target material vapors that may undesirably absorb EUV radiation, e.g. tin vapor when tin is used as a target material and/or to provide significant resistance to gas flow, thus, establishing a pressure gradient in the source vessel 110 with a relatively high gas pressure upstream of the vane structure 214, e.g. between the irradiation region 122 and collector mirror 118 to e.g. provide ion stopping and/or etching power, and a relatively low gas pressure downstream of the vane structure 214, e.g. between the vane structure 214 and the intermediate focus unit 130, to e.g. minimize EUV absorption.

FIG. 2B further shows that the source collector module SO may include external guideways 204a and 204b, a source valve 208, an adjustable pump 224, and a guideway 209 between the source valve 208 and the pump 224. The pump, e.g. turbopump or roots booster is used for selectively removing some or all of the gas from the source vessel 110 through the pump 204. Removal of gas via pump 224 from the source vessel 110 may be performed to remove contaminants, vapor, metal dust, etc. from the source vessel 110, and/or to provide a pressure gradient in the source vessel 110, e.g. to maintain a relatively large pressure between the collector mirror 118 and irradiation region 122 and a smaller, relatively low pressure between the irradiation region 122 and the intermediate focus unit 130.

In some embodiments, the gas exhaust rate is controlled by control mechanisms including the use of an exhaust gas control valve such as an electromagnetic valve, or a gas exhaust means such as a suction pump, and the use of a flap disposed in an exhaust pipe, the degree of opening of said flap being controlled. For example, the gas exhaust rate is controlled by the source valve 208 with the pump 224 as shown in FIG. 2B. In some embodiments, the size of an opening of the exhaust section is consecutively changed so as to control accurately the gas exhaust rate.

In some embodiments, the EUV lithography system 10 permits changing the gas exhaust rate in accordance with different stage of the operation thereof. The size of the opening of the source valve 208 as shown in FIG. 2B is controlled to permit the gas exhaust rate to change. The gas exhaust rate is continuously detected by the exhaust rate detecting means such as gas monitors 228 and 229, and the size of the opening is controlled to conform with the detected gas exhaust rate.

Referring to FIG. 2B, The EUV lithography system 10 further includes a master controller 157, a control unit 155, and a converter 158 connected between the control unit 155 and the source valve 208. The master controller 157 is configured to determine whether the amplified laser beam 104 (e.g., laser pulses) generated from the laser source 102 intercepts the fuel droplets 112 generated from the droplet generator 120 (shown in FIG. 2A). As shown in FIG. 2B, the master controller 157 is determined that the laser pulses properly intercept the droplets in the right place and time for effective and efficient EUV light production. When the amplified light beam 104 strikes the fuel droplets 112, the fuel droplets 112 is converted into a plasma state that has an element with an emission line in the EUV range. In some embodiments, the pulses of the laser source 102 and the droplet generating rate of the fuel droplet generator 120 are controlled to be synchronized such that the fuel droplet generator 120 receive peak powers consistently from the laser pulses of the laser source 102. In some examples, the droplet generation frequency ranges from 20 kHz to 100 kHz. For example, the laser source 102 includes a laser circuit designed to control the generation of the laser pulses. The laser circuit and the fuel droplet generator 120 are coupled to synchronize the generation of the laser pulses and the generations of the Tin droplets.

At the same time, the master controller 157 receives an output signal from the EUV energy monitor 150 (shown in FIG. 2A) and performs an analysis based at least in part on this received output to actuate the control unit 155. In some embodiments, the control unit 155 further actuates the scanner 200 to perform a photolithography process on the substrate W1. The control unit 155 therefore provides a signal to the converter 158 to adjust an open ratio (cross-section ratio of the passages and material, e.g., gas) of the source valve 208. In some embodiments, the open ratio of the source valve 208 is in a range from about 20% to about 30%. Thus, control of the gas source 222 and the pump 224 in response to the adjustment of the source valve 208 may be used to maintain a selected gas number density in the irradiation region 122 of the source vessel 110 and/or pressure gradient and/or to maintain a selected flow rate through the source vessel 110 and or to maintain a selected gas composition, e.g. a selected ratio of several gases, e.g. $H_2$, HBr, He, etc. Therefore, amount of the plasma 114 can be generated for creating effective and efficient EUV light.

In some embodiments, the open ratio of the source valve 208 is maintained during the photolithography process on the substrate W1 and during the providing of the gas 271 to the source vessel 110. Further, the gas exhaust rate of the source vessel 110 is maintained, and thus the pressure in the source vessel is substantially a constant.

FIG. 2B further shows that gas monitors 228 and 229 measuring one or more gas characteristic including, but not limited to, gas temperature, pressure, composition, e.g. $He/H_2$ ratio, HBr gas concentration, etc. may be disposed in the source vessel 110 or placed in fluid communication therewith to provide one or more signals indicative thereof to a gas management system controller (not shown), which, in turn, may control the pumps, regulators, etc. to maintain a selected gas temperature, pressure and/or composition. Specifically, the gas monitor 228 is disposed within the vane structure 214 and above the collector mirror 118. The gas monitor 229 is disposed between the vane structure 214 and an inner sidewall of the source vessel 110 and adjacent to the guideways 204a and/or 204b.

Figure 7:
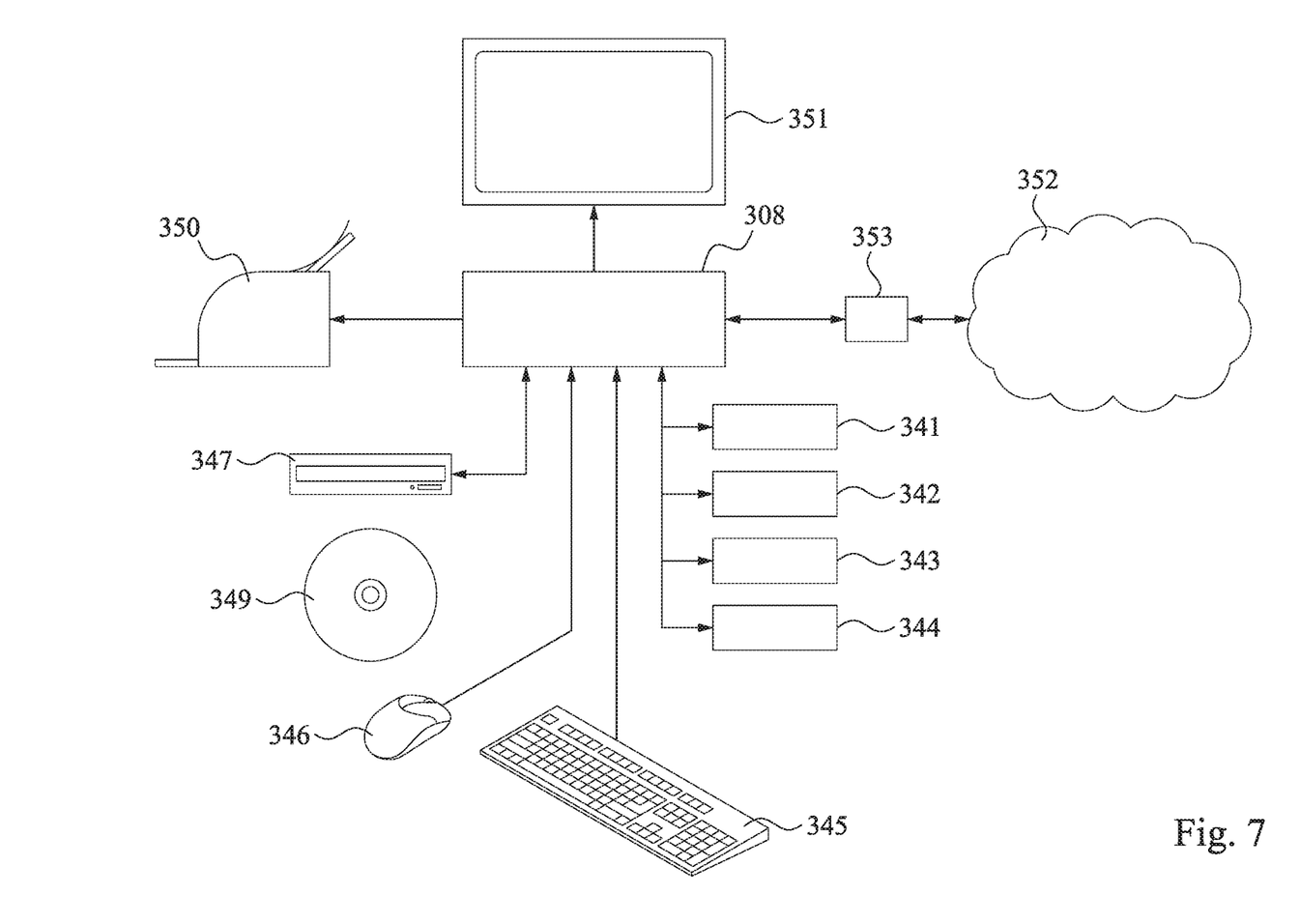
FIG. 7 is a schematic view of a computer including a controller in accordance with some embodiments of the present disclosure.

In some embodiments, the master controller 157 and/or a memory 156 connected to the master controller 157 either one of them may be part of a computer assembly as described with reference to FIG. 7. It should be understood that a master controller 157 as used throughout this text can be implemented in a computer assembly as shown in FIG. 7. The memory 156 may comprise a number of memory components like a hard disk 341, Read Only Memory (ROM) 342, Electrically Erasable Programmable Read Only Memory (EEPROM) 343, and/or Random Access Memory (RAM) 344. Not all aforementioned memory components need to be present.

Furthermore, it is not essential that aforementioned memory components are physically in close proximity to the master controller 157 or to each other. In some embodiments, the aforementioned memory components may be located at a distance away.

The master controller 157 may also be connected to some kind of user interface, for instance a keyboard 345 or a mouse 346 shown in FIG. 7. A touch screen, track ball, speech converter or other interfaces that are known to persons skilled in the art may also be used.

The master controller 157 may be connected to a reading unit 347 shown in FIG. 7, which is arranged to read data from and under some circumstances store data on a data carrier, like a CDROM 349. Also DVD's or other data carriers known to persons skilled in the art may be used.

The master controller 157 may also be connected to a printer 350 shown in FIG. 7 to print out output data on paper as well as to a display 351, for instance a monitor or LCD (Liquid Crystal Display), of any other type of display known to a person skilled in the art.

The master controller 157 may be connected to a communications network 352 shown in FIG. 7, for instance a public switched telephone network (PSTN), a local area network (LAN), a wide area network (WAN) etc. by way of transmitters/receivers 353 responsible for input/output (I/O). The master controller 157 may be arranged to communicate with other communication systems via the communications network 352. In some embodiments of the external computers (not shown), for instance personal computers of operators, can log into the master controller 157 via the communications network 352.

The master controller 157 may be implemented as an independent system or as a number of processing units that operate in parallel, wherein each processing unit is arranged to execute sub-tasks of a larger program. The processing units may also be divided in one or more main processing units with several subprocessing units. Some processing units of the master controller 157 may even be located a distance away of the other processing units and communicate via communications network 352 shown in FIG. 7.

Figure 3:
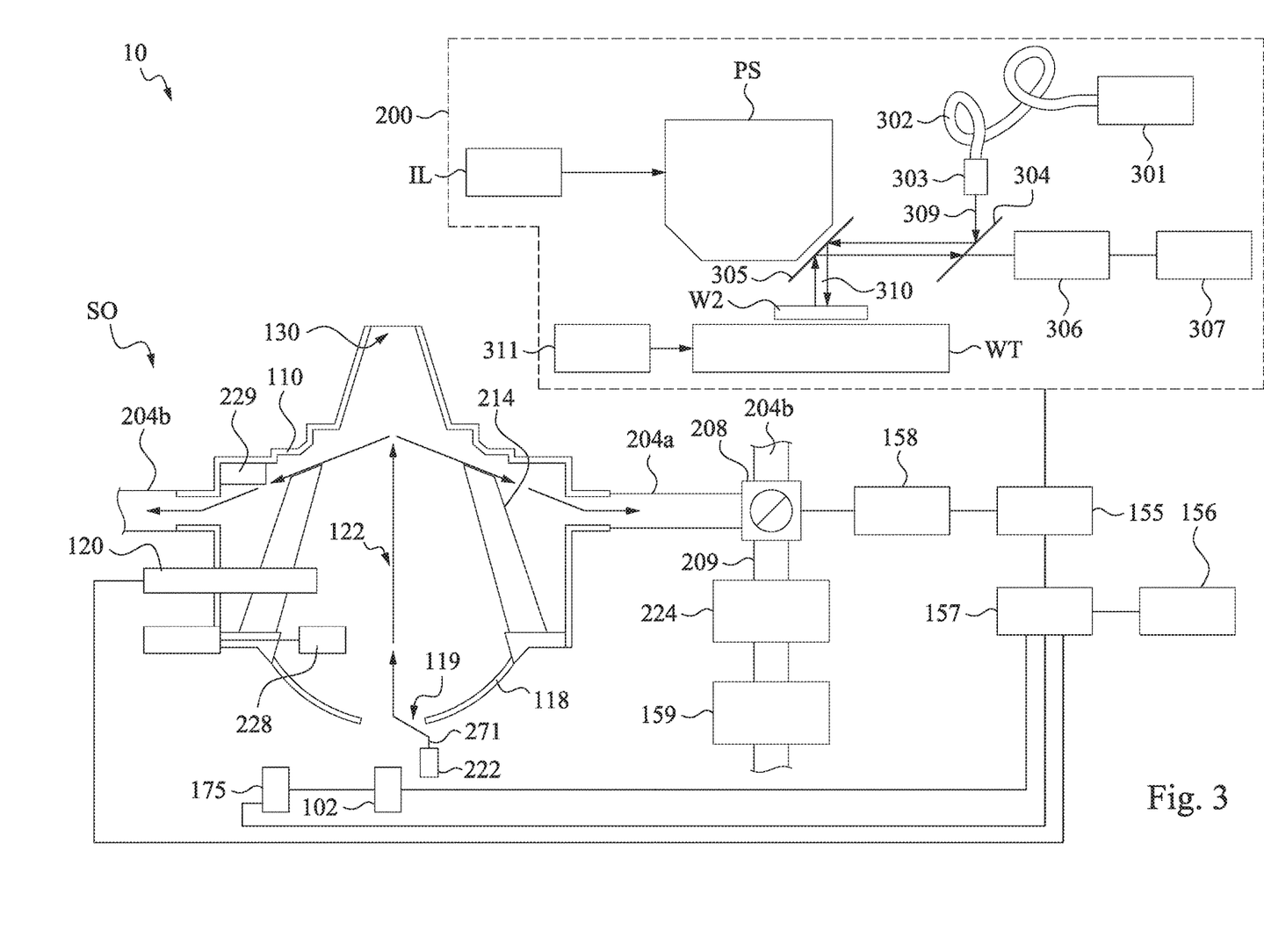
FIG. 3 is schematic view of a EUV lithography system including an alignment module that is used for a photomask in accordance with some embodiments of the present disclosure.

Returning to FIG. 1, the method M then proceeds to block S104 where the generation of the first EUV radiation is halted. With reference to FIG. 3, in some embodiments of block S104, the master controller 157 is determined that the laser pulses generated from the laser source 102 are spaced apart from the fuel droplet generator 120 as shown in FIG. 2A, and thus there is no EUV radiation that is generated from the source collector module SO. In the meantime, the gas 271 may be continuously provided to the source vessel 110 after the halting. In some embodiments, the master controller 157 receives an output signal from the EUV energy monitor 150 (shown in FIG. 2A) and performs an analysis based at least in part on this received output to actuate the control unit 155. In some embodiments, the control unit 155 further actuates the scanner 200 to calibrate a next processed substrate W2.

Returning to FIG. 1, the method M then proceeds to block S105 where the first gas exhaust rate of the vessel is increased to a second gas exhaust rate by increasing an open ratio of a valve in a pump, in which the valve is connected to the vessel. With reference to FIG. 3, in some embodiments of block S105, the control unit 155 therefore provides a signal to the converter 158 to increase the open ratio of the source valve 208. That is, the controller 155 configured to increase open ratio of the source valve 208 in response to a turn-off operation of the fuel droplet generator 120 and a turn-off operation of the laser source 102. In some embodiments, the open ratio of the source valve 208 shown in FIG. 3 is to increase in a range from about 30% to about 50% and there is no plasma 114 as shown in FIG. 2B generated during the adjusting of the open ratio of the source valve 208. Thus, in response to the adjustment of the source valve 208, the pump 224 may be used to increase the second gas exhaust rate than about 400 l/s. In some embodiments, pressure in the vessel is lowered to a second pressure less than the first pressure mentioned-above in response to the change of the gas exhaust rate. In some embodiments, the pressure may be lower to be less than about 1 mm Bar in the source vessel 110 in response to the change of the gas exhaust rate. Hence, a flow rate of the gas through the source vessel 110 may be enhanced so as to increase the efficiency of carrying the debris away from the source vessel 110. In some embodiments, the gas exhaust rate of the source vessel 110 shown in FIG. 3 that in response to the adjustment of the source valve 208 is different from the gas exhaust rate of the source vessel 110 shown in FIG. 2B. In some embodiments, a pressure in the source vessel 110 shown in FIG. 3 that in response to the adjustment of the valve 208 is different from a pressure in the source vessel 110 shown in FIG. 2B.

In some embodiments, the second gas exhaust rate is greater than about 350 L/s to increase the efficiency of carrying the debris away from the source vessel 110 shown in FIG. 3. In some embodiments, the second gas exhaust rate is greater than about 450 Ls to increase the efficiency of carrying the debris away from the source vessel 110 shown in FIG. 3.

In some embodiments, the open ratio of the source valve 208 is maintained during the alignment process of the substrate W2 and during the providing of the gas 271 to the source vessel 110. Further, the gas exhaust rate of the source vessel 110 is maintained, and thus the pressure in the source vessel is substantially a constant.

Returning to FIG. 1, the method M then proceeds to block S106 where a second substrate is calibrated during providing of the gas in the vessel at the second gas exhaust rate, in which the second substrate will be exposed to a second EUV radiation directed through the collector in the vessel. With reference to FIG. 3, in some embodiments of block S106, the next processed substrate W2, that will be exposed to an EUV radiation directed through the collector in the vessel, is provided. 10051) FIG. 3 shows a schematic example of a field image alignment arrangement in the scanner 200. Such an alignment arrangement is based on a static measurement. The field image alignment arrangement of FIG. 3 comprises a light source 301, which is a broadband source. The light source 301 is connected to one end of a fiber 302. A transmitter 303 is connected to the opposite end of the fiber 302. Optics to provide an alignment beam towards a mark on a substrate W2 include a semi-transparent mirror 304 and a mirror 305. Imaging optics 306 are provided to receive alignment radiation back from the mark M3 and to provide a suitable optical image to a detector 307, e.g., a charged coupled device (CCD). The detector 307 is connected to a processor 308. The processor 308 in its turn is connected to an actuator 311 and a memory 156. The actuator 311 is connected to the substrate table WT, on which the substrate W2 can be placed.

In use, the light source 301 produces a broadband light beam that is output via the fiber 302 to the transmitter 303. The transmitter 303 provides a broadband light beam 309 that is reflected by the semi-transparent mirror 304 to the mirror 305. Mirror 305 produces a broadband light beam 310 to be directed to the mark on the substrate W2. The broadband light beam 310 impinging on the mark is reflected back as alignment radiation to the mirror 305. The mirror 305 reflects the received light to the semi-transparent mirror 304 which passes at least a portion of the received light to the imaging optics 306. The imaging optics 306 is arranged to collect the received alignment radiation and to provide a suitable optical image to the detector 307. The detector 307 provides an output signal to the control unit 155 that depends on the content of the optical image received from the imaging optics 306. The output signal that is received from the detector 307 as well as results of actions performed by the control unit 155 may be stored in a memory. The control unit 155 calculates a position of the alignment mark based on one or more of the output signal it receives from the detector 307. It then provides a further output signal to the actuator 311. The actuator 311 is arranged to move substrate table WT. Upon reception of the further output signal the actuator 11 moves the substrate table WT towards a desired position.

Returning to FIG. 1, the method M then proceeds to block S107 where the gas is directed from a collector toward an intermediate focus (IF) unit in the vessel at the second gas exhaust rate, so as to carry the debris away from the collector to remove the debris from the vessel. With reference to FIG. 3, in some embodiments of block S107, during the providing of the gas in the source vessel 110 at the higher gas exhaust rate, the gas is directed from a collector mirror 118 toward an intermediate focus (IF) unit 130 in the source vessel 110 and further toward the pump 224, in response to the adjusting of the open ratio of the source valve 208. Thus, the debris is carried away from the collector mirror 118 by the gas, passes through a plasma site where the plasma 114 is generated as shown in FIG. 2B, and is further removed from the source vessel 110.

In some embodiments, the EUV lithography system 10 may include filter 159. The filter 159 may function to remove at least a portion of a target species, e.g. contaminants that may degrade optical components and/or absorb EUV light, from gas flowing in the flow path. For example, when a tin containing material is used as a source material to generate the plasma, contaminants such as tin hydrides, tin oxides and tin bromides may be present in the gas which may degrade optical components and/or absorb EUV light. These contaminants may be removed using one or more suitable filters, e.g. zeolite filters, cold traps, chemical absorbers, etc.

Figure 4:
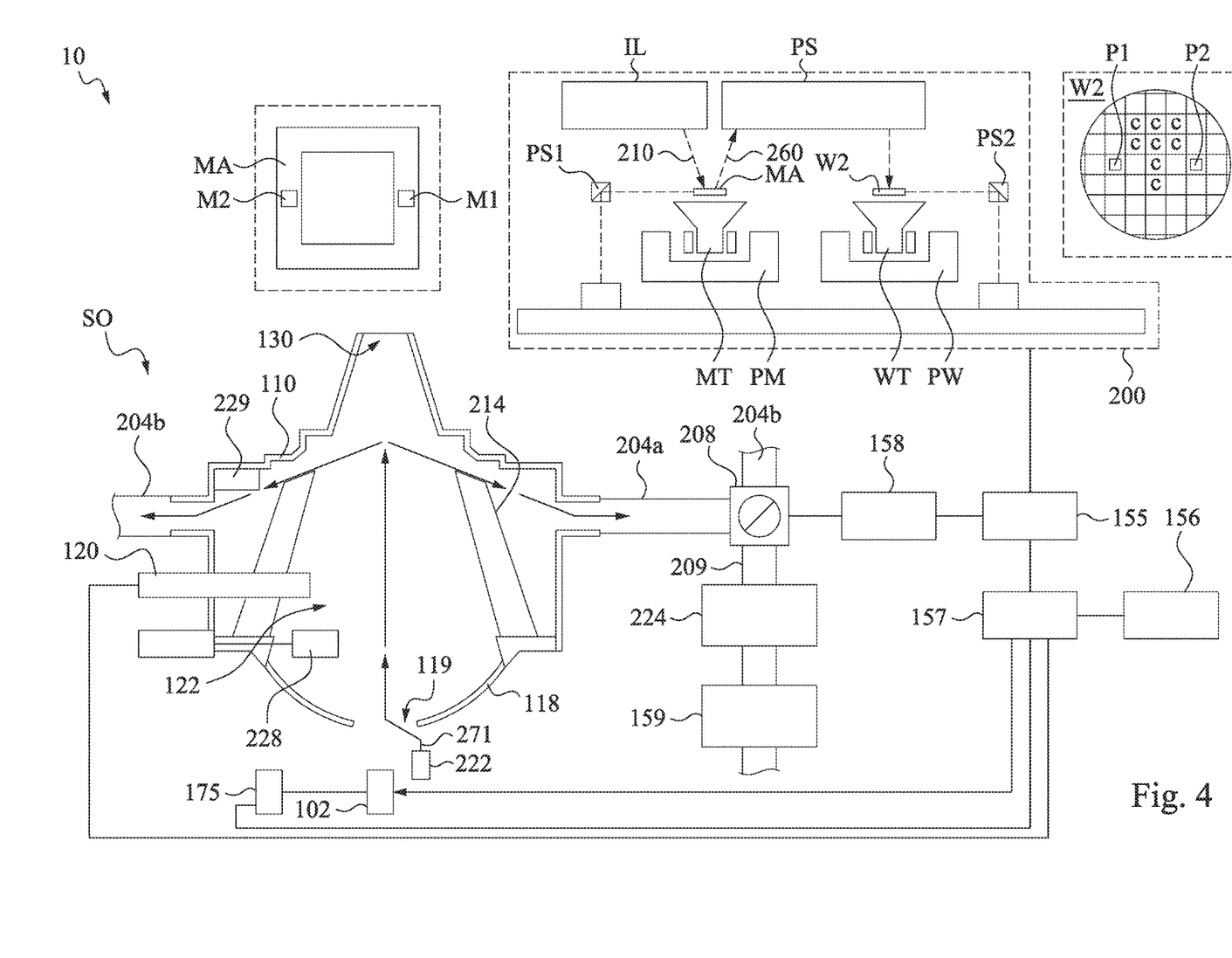
FIG. 4 is schematic view of a EUV lithography system including an alignment module that is used for a substrate in accordance with some embodiments of the present disclosure.

Returning to FIG. 1, the method M then proceeds to block S108 where an EUV photomask is calibrated. The EUV photomask will be exposed to the second EUV radiation directing from the vessel, during providing of the gas in the vessel at the second gas exhaust rate. With reference to FIG. 4, in some embodiments of block S108, the scanner 200 of the EUV lithography system 10 further includes a first positioner PM and a second positioner PW. The first positioner PM is connected to the support structure (e.g. a mask table) MT and is configured to accurately position the patterning device. The second positioner PW is connected to the substrate table (e.g. a wafer table) WT and is configured to accurately position the substrate W2. The projection system PS is configured to project a pattern imparted to the patterned beam 260 by the patterning device MA onto a target portion C (e.g. comprising one or more dies) of the substrate W2.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Referring to FIG. 4, the illumination system IL receives an extreme ultra violet (EUV) radiation beam from the source vessel 110. The radiation beam 210 from the illumination system IL is incident on the patterning device (e.g. mask) MA, which is held on the support structure (e.g. mask table) MT, and is patterned by the patterning device. After being reflected from the patterning device (e.g. mask) MA, the patterned beam 260 passes through the projection system PS, which focuses the beam onto a target portion C of the substrate W2. With the aid of the second positioner PW and position sensor PS2 (e.g. an interferometric device, linear encoder or capacitive sensor), the substrate table WT can be moved accurately, e.g. so as to position different target portions C in the path of the radiation beam 210 and the patterned beam 260. Similarly, the first positioner PM and another position sensor PS1 can be used to accurately position the patterning device (e.g. mask) MA with respect to the path of the radiation beam B. Patterning device (e.g. mask) MA and substrate W2 may be aligned using mask alignment marks M1 and M2 and substrate alignment marks P1 and P2.

The depicted apparatus could be used in at least one of the following modes:

Firstly, in step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

Secondly, in scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

Thirdly, in another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Referring to FIG. 4, the control unit 155 therefore provides a signal to the converter 158 to adjust the open ratio of the source valve 208. In some embodiments, the open ratio of the source valve 208 shown in FIG. 4 is in a range from about 30% to about 50% and there is no plasma 114 as shown in FIG. 2B generated during the adjusting of the open ratio of the source valve 208. Thus, control of the pump 224 in response to the adjustment of the source valve 208 may be used to control the gas exhaust rate in the source vessel 110 to be greater than about 400 L/s. In some embodiments, the pressure may be less than about 1 mm Bar in the source vessel 110 in response to the change of the gas exhaust rate. Hence, a flow rate of the gas through the source vessel 110 may be enhanced so as to increase the efficiency of carrying the debris away from the source vessel 110. In some embodiments, the gas exhaust rate of the source vessel 110 shown in FIG. 4 that in response to the adjustment of the source valve 208 is different from the gas exhaust rate of the source vessel 110 shown in FIG. 2B. In some embodiments, a pressure in the source vessel 110 shown in FIG. 4 that in response to the adjustment of the source valve 208 is different from a pressure in the source vessel 110 shown in FIG. 2B.

In some embodiments, the gas exhaust rate is greater than about 350 L/s to increase the efficiency of carrying the debris away from the source vessel 110 shown in FIG. 4. In some embodiments, the gas exhaust rate is greater than about 450 Ls to increase the efficiency of carrying the debris away from the source vessel 110 shown in FIG. 4.

In some embodiments, the open ratio of the source valve 208 is maintained during the alignment process of the photomask and during the providing of the gas 271 to the source vessel 110. Further, the gas exhaust rate of the source vessel 110 is maintained, and thus the pressure in the source vessel is substantially a constant.

During the providing of the gas in the source vessel 110 at the higher gas exhaust rate, the gas is directed from a collector mirror 118 toward an intermediate focus (IF) unit 130 in the source vessel 110 and further toward the pump 224, in response to the adjusting of the open ratio of the source valve 208. Thus, the debris is carried away from the collector mirror 118 by the gas, passes through a plasma site where the plasma 114 is generated as shown in FIG. 2B, and is further removed from the source vessel 110.

Figure 5:
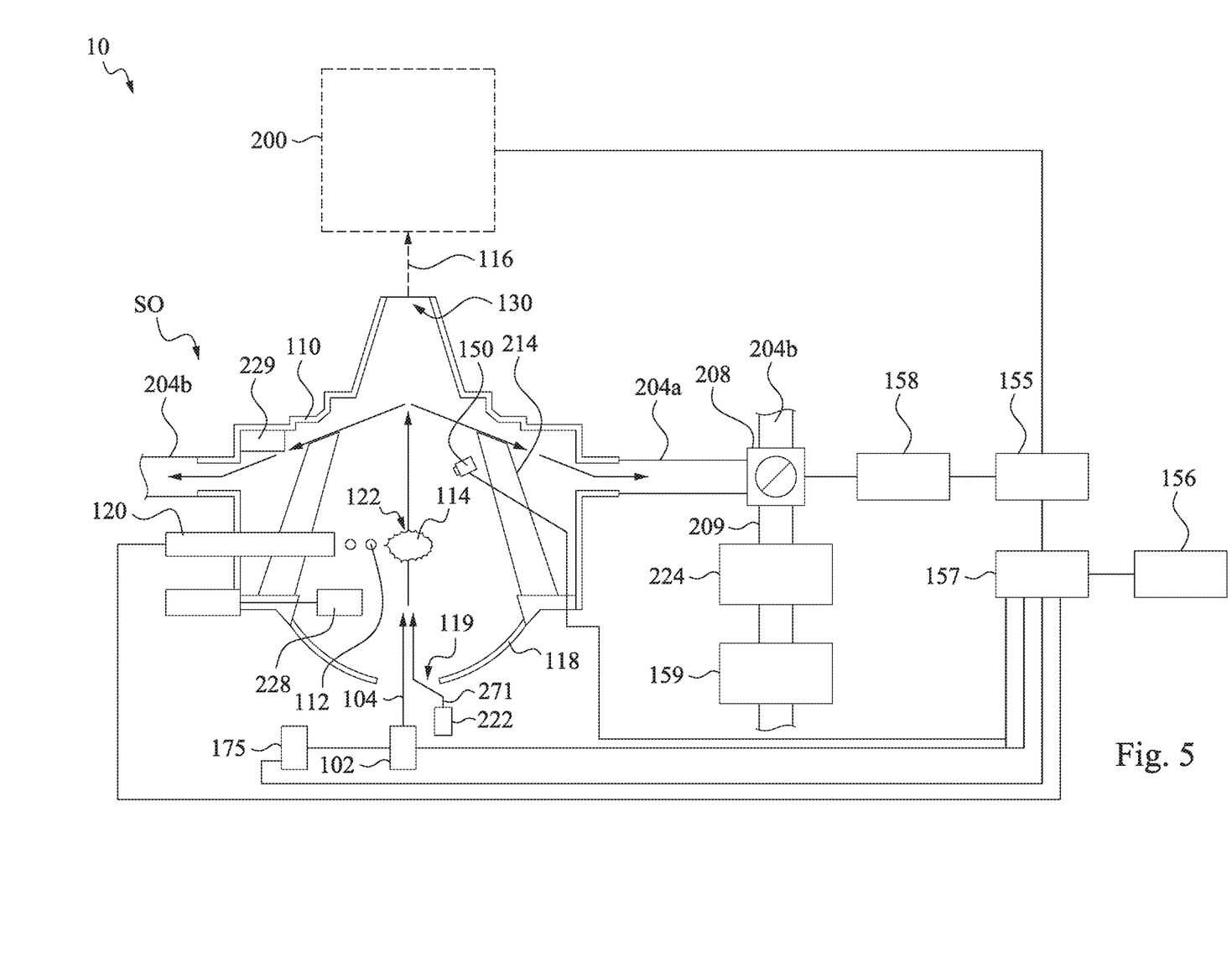
FIG. 5 is schematic view of a EUV lithography system including an alignment module with a light source in accordance with some embodiments of the present disclosure.

Returning to FIG. 1, the method M then proceeds to block S109 where the second exhaust rate of the vessel is decreased to the first exhaust rate by decreasing the open ratio of the valve for the next processing in the vessel, such as a calibrating process on the intensity of a second EUV radiation. With reference to FIG. 5, in some embodiments of block S109, the master controller 157 is determined that the laser pulses properly intercept the droplets in the right place and time for effective and efficient EUV light production for a calibrating process on the intensity of EUV radiation which will be carried out later. When the amplified light beam 110 strikes the fuel droplets 112, the fuel droplets 112 is converted into a plasma state that has an element with an emission line in the EUV range.

At the same time, the master controller 157 receives an output from the EUV energy monitor 150 (shown in FIG. 2A) and performs an analysis based at least in part on this received output to actuate the control unit 155. The control unit 155 therefore provides a signal to the converter 158 to decrease the open ratio of the source valve 208. In some embodiments, the open ratio of the source valve 208 shown in FIG. 5 is decreased in a range from about 20% to about 30%. Thus, in response to the adjustment of the source valve 208, the pump 224 may be used to decrease the gas exhaust rate to be less about 400 l/s. In some embodiments, pressure in the vessel is increased to be higher than the second pressure mentioned-above in response to the change of the gas exhaust rate. In some embodiments, in response to the adjustment of the source valve 208, the pump 224 may be used to maintain a selected gas number density in the irradiation region 122 of the source vessel 110 and/or pressure gradient and/or to maintain a selected flow rate through the source vessel 110 and or to maintain a selected gas composition, e.g. a selected ratio of several gases, e.g. H2, HBr, He, etc. Therefore, amount of the plasma 114 can be generated for creating effective and efficient EUV light.

In some embodiments, the gas exhaust rate is less than about 350 L/s to maintain a selected gas number density and/or a selected gas composition in the irradiation region 122 of the source vessel 110 shown in FIG. 5. In some embodiments, the gas exhaust rate is less than about 450 Ls to maintain a selected gas number density and/or a selected gas composition in the irradiation region 122 of the source vessel 110 shown in FIG. 5.

In some embodiments, the open ratio of the source valve 208 is maintained during a next processed calibrating process on an intensity of the EUV radiation for the next processed substrate and during the providing of the gas 271 to the source vessel 110. Further, the gas exhaust rate of the source vessel 110 is maintained, and thus the pressure in the source vessel is substantially a constant.

Returning to FIG. 1, the method M then proceeds to block SI where an intensity of the second EUV radiation generated in the vessel is calibrated. In some embodiments, a photolithography process will be performed on the substrate W2 after the calibration of the intensity of the EUV radiation. With reference to FIG. 5, in some embodiments of block S110, the EUV energy monitor 150 is configured to sample differences in energy up and down and left and right around the light beam 104 to determine the positional relationship between the light beam 104 and the irradiation region 122. The master controller 157 receives an output from the EUV energy monitor 150 and performs an analysis based at least in part on this received output to determine the relative alignment between the drive axis of the amplified light beam 104 and plasma 114.

The EUV lithography system 10 can also include a guide laser 175 that can be used to align various sections of the EUV lithography system 10 or to assist in steering the amplified light beam 104 to the irradiation region 122. In connection with the guide laser 175, the EUV lithography system 10 includes a sampling apparatus 124 (see FIG. 2A) that is placed within the focusing system 108 to sample a portion of light from the guide laser 175 and the amplified light beam 104. In other implementations, the sampling apparatus 124 is placed within the beam transport system 106. The sampling apparatus 124 can include an optical element that samples or re-directs a subset of the light, such optical element being made out of any material that can withstand the powers of the guide laser beam and the amplified light beam 104. The sampling apparatus 124 can include an optical sensor that captures images of diagnostic portions of the sampled light, and the optical sensor can output an image signal that can be used by the master controller 157 for diagnostic purposes. In FIG. 5, the master controller 157 analyzes the output from the EUV energy monitor 150 and uses this information to adjust components including the focusing system 108, the beam transport system 106, guide laser 175, and/or sampling apparatus 124 shown in FIG. 2A.

Figure 6:
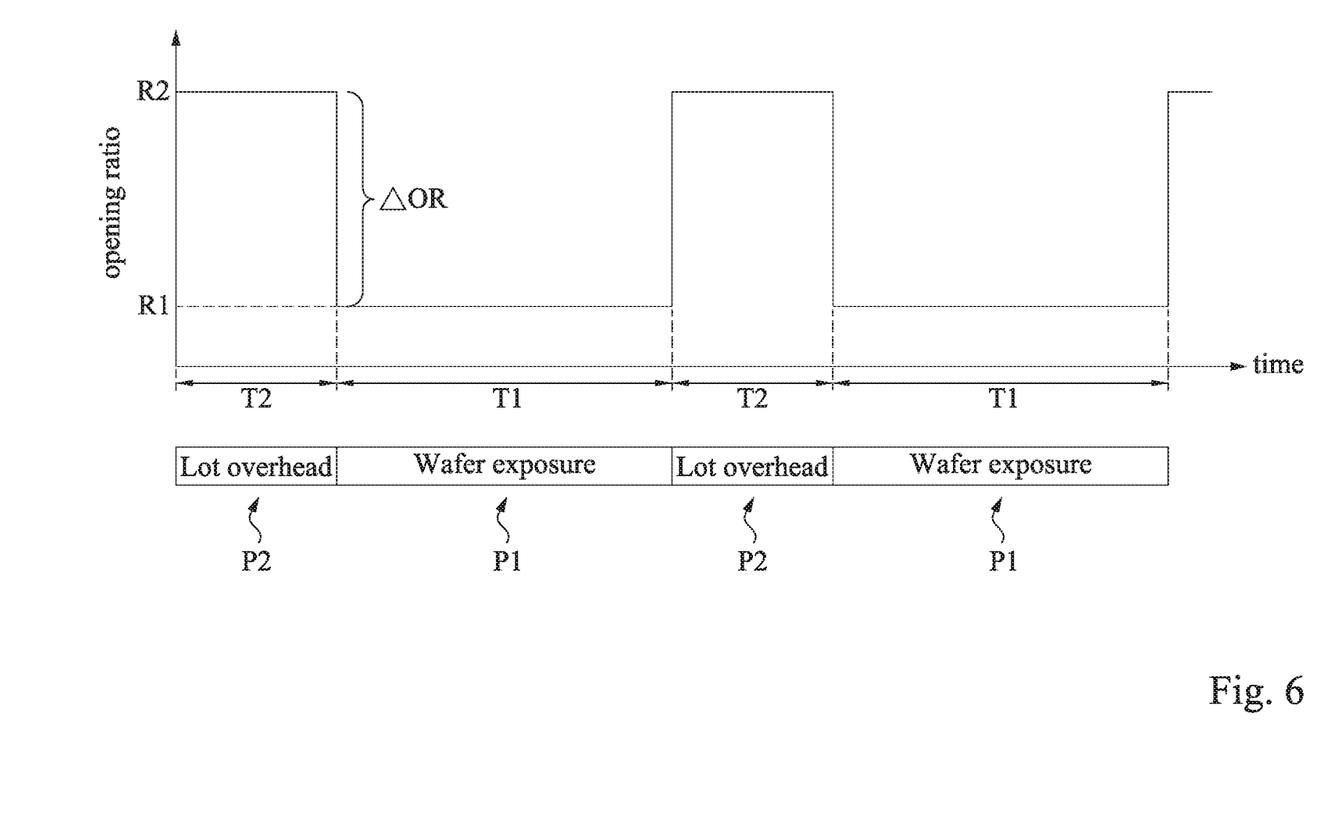
FIG. 6 is a graph showing an open ratio of a valve as a function of time for the exemplary structure as shown in FIGS. 2A-5 with some embodiments of the present disclosure.

In some embodiments, the alignment process of the substrate W2, the alignment process of the photomask, the calibrating process on the intensity of the EUV radiation, and the photolithography process are described with reference to FIG. 6. It should be understood that the photolithography process and calibrating process on the intensity of the EUV radiation the can be implemented in a wafer exposure process P1, and the alignment processes of the substrate and the photomask can be implemented in a lot overhead process P2 as used throughout this text. In some embodiments, an open ratio R2 of the source valve 208 used in the lot overhead process P2 is greater than an open ratio R1 of the source valve 208 used in the wafer exposure process P1, and thus the gas exhaust rate of the source vessel 110 in response to the open ratio R2 of the source valve 208 is less than that in response to the open ratio R1 of the source valve 208. In some embodiments, the open ratios R1 and R2 are substantially constant. In some embodiments, the wafer exposure process P1 is performed at a duration time T1 greater than a duration time T2 performed by the lot overhead process P2.

Based on the above discussion, it can be seen that the present disclosure offers advantages. It is understood, however, that other embodiments may offer additional advantages, and not all advantages are necessarily disclosed herein, and that no particular advantages is required for all embodiments.

One advantage is that the open ratio of the valve used in the lot overhead process exhibits strong ability to exclude tin dusts from the source vessel compared to that used in the wafer exposure process, and thus improve vessel cleanness to extending lifetime of the source collector.

Another advantage is that the valve with greater open ratio compared to that used in the wafer exposure process may function to remove the target species, e.g. contaminants that may degrade optical components and/or absorb EUV light, from gas flowing in the flow path, and thus the EUV light may be generated effective and efficient.

Another advantage is that the open ratio of the valve used in the wafer exposure process is different from that used in the lot overhead process, so as to maintain a selected gas number density in the irradiation region of the source vessel during the exposure process for creating effective and efficient EUV light.

In some embodiments, a method includes generating a plasma that emits a first EUV radiation in a vessel at a first gas exhaust rate of the vessel; directing the first EUV radiation to a first substrate using a collector in the vessel; halting the generating of the first EUV radiation; and ejecting a gas past the collector at a second gas exhaust rate of the vessel, in which the second gas exhaust rate is greater than the first gas exhaust rate after the halting.

In some embodiments, a method includes providing a gas in a vessel; generating a plasma that emits an EUV radiation in the vessel during providing the gas; halting the generating of the EUV radiation and keep providing the gas; and increasing an open ratio of a source valve that is connected to a pump, wherein the source valve is in gas communication with the vessel.

In some embodiments, a system includes an EUV source vessel, a fuel droplet generator, a laser source, a collector, a gas source, a pump, a gas line, a source valve, and a controller. The fuel droplet generator is connected to the EUV source vessel. The laser source is connected to the EUV source vessel. The collector is disposed in the EUV source vessel and has an opening. The gas source is configured to provide a gas through the opening of the collector. The gas line connects the pump and the EUV source vessel. The source valve is in the gas line. The controller is configured to increase an open ratio of the source valve in response to a turn-off operation of the fuel droplet generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating a plasma that emits a first EUV radiation in a vessel while the vessel is exhausted at a first gas exhaust rate;
   directing the first EUV radiation to a first substrate using a collector in the vessel, wherein the first EUV radiation passes through a vane structure that laterally surrounds the collector and is connected to an upper end surface of the collector, the vane structure comprises an inner sidewall, an outer sidewall laterally surrounding the inner sidewall and shorter than the inner sidewall, and a topmost surface sloped along a direction to form an acute angle with a center axis of the collector, and an interior of the acute angle that extends away from a vertex of the acute angle formed by the center axis of the collector and the topmost surface overlaps the collector;
   monitoring an intensity of the first EUV radiation; and
   exhausting the vessel at a second gas exhaust rate in response to the monitored intensity of the first EUV radiation, wherein the second gas exhaust rate is greater than the first gas exhaust rate.

2. The method of claim 1, further comprising calibrating a second substrate during exhausting the vessel at the second gas exhaust rate, wherein the second substrate is exposed to a second EUV radiation directed through the collector in the vessel after exhausting the vessel at the second gas exhaust rate is complete.

3. The method of claim 1, further comprising calibrating an EUV photomask during exhausting the vessel at the second gas exhaust rate, wherein the EUV photomask is exposed to a second EUV radiation directed through the collector in the vessel after exhausting the vessel at the second gas exhaust rate is complete.

4. The method of claim 1, further comprising calibrating an intensity of a second EUV radiation that generates in the vessel after exhausting the vessel at the second gas exhaust rate is complete.

5. The method of claim 1, wherein the first gas exhaust rate is performed at a first duration time and the second gas exhaust rate is performed at a second duration time that is less than the first duration time.

6. The method of claim 1, wherein the first gas exhaust rate is substantially constant.

7. The method of claim 1, wherein the second gas exhaust rate is substantially constant.

8. The method of claim 1, wherein the generating of the plasma is performed such that debris falls on the collector, and the exhausting the vessel at the second gas exhaust rate is performed such that the debris is carried away from the collector.

9. The method of claim 8, wherein the debris comprises tin.

10. The method of claim 1, wherein the first and second gas exhaust rates are measured by a gas monitor that is surrounded by the vane structure and above the upper end surface of the collector.

11. A method, comprising:
    providing, in a vessel, a gas passing through a collector and a vane structure laterally surrounding the collector and connected to an upper end surface of the collector, wherein the vane structure has an inner sidewall and an outer sidewall laterally surrounding the inner sidewall, and a topmost position of the outer sidewall is lower than a topmost position of the inner sidewall;
    generating a plasma that emits an EUV radiation in the vessel during providing the gas;
    halting the generating of the EUV radiation and while continuing to provide the gas; and
    increasing an open ratio of a source valve that is connected to a pump, wherein the source valve is in gas communication with the vessel, and an imaginary plane formed by extending along and past a top surface of the vane structure passes through an outlet of the vessel that is in gas communication with the source valve.

12. The method of claim 11, wherein the increasing the open ratio of the source valve is performed after the halting of the generating of the EUV radiation.

13. The method of claim 12, wherein the increasing the open ratio of the source valve is performed such that a first gas exhaust rate of the vessel after the halting is greater than a second gas exhaust rate of the vessel before the halting.

14. The method of claim 13, wherein the first gas exhaust rate is performed at a first duration time and the second gas exhaust rate is performed at a second duration time that is less than the first duration time.

15. The method of claim 11, wherein the providing of the gas is substantially performed at a constant flow rate.

16. The method of claim 11, wherein the generating of the plasma is performed such that debris falls on the collector, and the increasing of the open ratio of the source valve is performed such that the gas carry the debris away from the collector.

17. The method of claim 11, wherein the increasing the open ratio of the source valve is performed such that a first gas exhaust rate of the vessel after the halting is different than a second gas exhaust rate of the vessel before the halting, and wherein the first and second gas exhaust rates are measured by a gas monitor that is disposed between the outer sidewall of the vane structure and an inner sidewall of the vessel.

18. A system, comprising:
an EUV source vessel;
a fuel droplet generator connected to the EUV source vessel;
a laser source connected to the EUV source vessel;
a collector in the EUV source vessel and having an opening;
a gas source configured to provide a gas through the opening of the collector;
a vane structure above and laterally surrounding the collector and connected to an upper end surface of the collector, wherein the vane structure comprises an inner sidewall and an outer sidewall laterally surrounding the inner sidewall and shorter than the inner sidewall, and the inner sidewall of the vane structure is coplanar with an inner sidewall of the EUV source vessel immediately adjacent to an exit aperture of the EUV source vessel;
a pump;
a gas line connecting the pump and the EUV source vessel;
a source valve in the gas line; and
a controller configured to increase an open ratio of the source valve in response to a turn-off operation of the fuel droplet generator.

19. The system of claim 18, wherein an imaginary plane formed by extending along and past a top surface of the vane structure passes through an outlet of the EUV source vessel that is connected to the gas line.

20. The system of claim 18, wherein the vane structure comprises a topmost surface sloped along a direction to form an acute angle with a center axis of the collector, and an interior of the acute angle that extends away from a vertex of the acute angle formed by the center axis of the collector and the topmost surface overlaps the collector.

* * * * *